(12) United States Patent
Flükiger et al.

(10) Patent No.: US 9,012,366 B2
(45) Date of Patent: Apr. 21, 2015

(54) DEVICE AND METHOD FOR THE DENSIFICATION OF FILAMENTS IN A LONG SUPERCONDUCTIVE WIRE

(75) Inventors: René Flükiger, Plan-Les-Onates (CH); Florin Buta, Les Acacias (CH); Carmine Senatore, Genéve (CH)

(73) Assignee: Bruker BioSpin AG, Faellanden (CH)

(*) Notice: Subject to any disclaimer, the term of this patent is extended or adjusted under 35 U.S.C. 154(b) by 678 days.

(21) Appl. No.: 13/398,865

(22) Filed: Feb. 17, 2012

(65) Prior Publication Data

US 2013/0345063 A1  Dec. 26, 2013

(30) Foreign Application Priority Data

Feb. 18, 2011  (EP) ..................................... 11154981

(51) Int. Cl.
*H01L 39/24* (2006.01)
*H01B 13/00* (2006.01)
*B30B 7/04* (2006.01)

(52) U.S. Cl.
CPC .............. *H01L 39/2487* (2013.01); *B30B 7/04* (2013.01); *H01L 39/24* (2013.01); *H01L 39/2409* (2013.01); *H01L 39/2412* (2013.01)

(58) Field of Classification Search
CPC ... H01L 39/141; H01L 39/24; H01L 39/2487; H01L 39/2412; H01L 39/2409; H01L 39/2419; H01L 39/248; H01B 13/00; B30B 7/04; C04B 35/45; C04B 35/4521; C04B 35/4525; C04B 35/58057
USPC .......................... 505/430, 431, 432, 433, 928; 174/125.1; 29/599; 264/104; 425/406
See application file for complete search history.

(56) References Cited

U.S. PATENT DOCUMENTS 3,440,687 A * 4/1969 Hall ................................ 425/77
3,837,210 A * 9/1974 Kralowetz ...................... 72/403
(Continued)

FOREIGN PATENT DOCUMENTS

EP    2 172 985    4/2010

OTHER PUBLICATIONS

Prikhna et al, "The inclusions of Mg-B (MgB12?) as potential pinning centres in high-pressure-high-temperature-synthesized or sintered magnesium diboride," Supercond. Sci. Technol. 20 (2007) S257-S263.*

(Continued)

*Primary Examiner* — Stanley Silverman
*Assistant Examiner* — Kallambella Vijayakumar
(74) *Attorney, Agent, or Firm* — Paul Vincent

(57) ABSTRACT

A device for the high pressure densification of superconducting wire from compacted superconductor material or superconductor precursor powder particles, has four hard metal anvils (5, 6, 7, 8) with a total length (L2) parallel to the superconducting wire, the hard metal anvils borne in external independent pressure blocks (9, 10, 11), which are in turn either fixed or connected to high pressure devices, preferably hydraulic presses. At least one of the hard metal anvils is a free moving anvil (6) having clearances of at least 0.01 mm up to 0.2 mm towards the neighboring hard metal anvils (5, 8), so that no wall friction occurs between the free moving anvil and the neighboring anvils. This allows for high critical current densities $J_c$ at reduced pressure applied to the hard metal anvils.

18 Claims, 4 Drawing Sheets

(56) References Cited

U.S. PATENT DOCUMENTS

| | | | |
|---|---|---|---|
| 6,239,080 B1* | 5/2001 | Chu et al. | 505/125 |
| 6,336,802 B1* | 1/2002 | Hall | 425/77 |
| 2010/0043520 A1* | 2/2010 | Sumiya et al. | 72/467 |
| 2010/0087324 A1* | 4/2010 | Fluekiger | 505/431 |

OTHER PUBLICATIONS

Flukiger et al, "Strong enhancement of Jc and Birr in binary in situ MgB2 wires after cold high pressure densification," Supercond. Sci. Technol. 22 (2009) 085002 (7pp).*

J. M. Hur et al., "Fabrication of high-performance $MgB_2$ wires by an internal Mg diffusion process", Supercond. Sci. Technol. 21 (2008) 032001 (4pp).

T. A. Prikhna et al., "Effect of higher borides and inhomogeneity of oxygen distribution on critical current density of undoped and doped magnesium diboride", Journal of Physics: Conference Series 234 (2010) 012031.

H. Yamada et al., "Improvement of the critical current properties of in situ powder-in-tube-processed $Mg8_2$ tapes by hot pressing", Supercond. Sci. Technol. 23 (2010) 045030 (4pp).

R. Fluekiger et al., "Strong enhancement of $J_c$ and $B_{irr}$ in binary in situ $MgB_2$ wires after cold high pressure densification", Supercond. Sci. Technol. 22 (2009) 085002 (7pp).

M.S.A. Hossain et al., "The enhanced $J_c$ and $B_{irr}$ of in situ $MgB_2$ wires and tapes alloyed with $C_4H_6O_5$ (malic acid) after cold high pressure densification", Supercond. Sci. Technol. 22 (2009) 000000 (8pp).

R. Fluekiger et al., "A new generation of in situ MgB2 wires with improved $J_c$ and $B_{irr}$ values obtained by Cold Densification (CHPD)", presented at the ASC, 2010v published in European Superconductivity News Forum, vol. 14, Oct. 23, 2010, ST194.

* cited by examiner

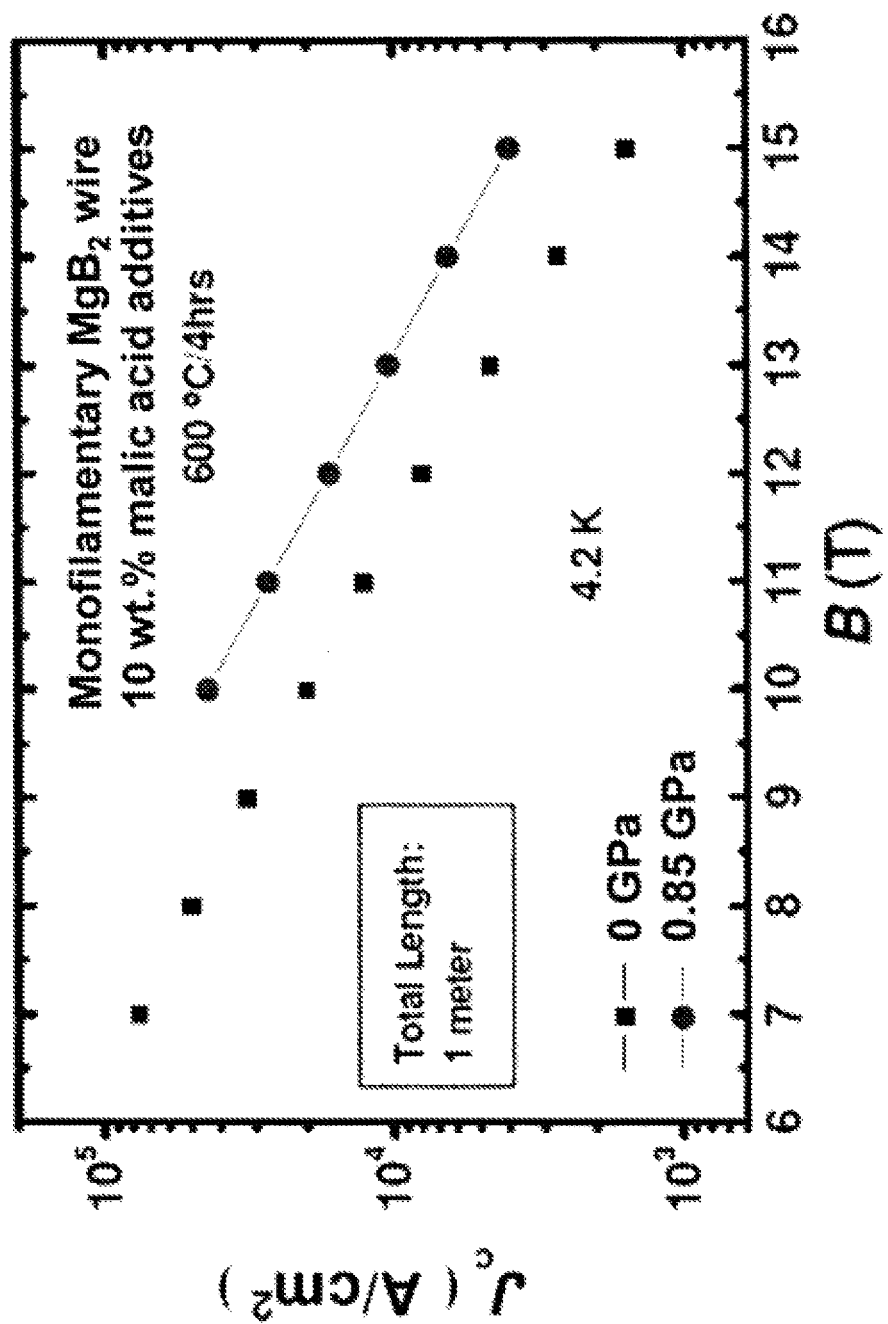

DEVICE AND METHOD FOR THE DENSIFICATION OF FILAMENTS IN A LONG SUPERCONDUCTIVE WIRE

This application claims Paris Convention priority of EP 11 154 981.2 filed Feb. 18, 2011 the complete disclosure of which is hereby incorporated by reference.

BACKGROUND OF THE INVENTION

The invention concerns a device for the high pressure densification of superconducting wire out of compacted superconductor material or superconductor precursor powder particles, said device comprising four hard metal anvils with a total length parallel to the superconducting wire, said hard metal anvils relied to external independent pressure blocks, which are in turn either fixed or connected to high pressure devices, preferably hydraulic presses.

A device as described above is known from EP 2 172 985 A1.

Ten years after the discovery of superconductivity in $MgB_2$, the fabrication of binary and alloyed $MgB_2$ wires has now reached the industrial level, and kilometer lengths of wires can be produced, which may be used for various applications, e.g. magnetic resonance imaging (MRI), low field NMR magnets, fault current limiters and high current connections. A further application is the partial replacement of the considerably more expensive $Nb_3Sn$ wires in high field magnets, particularly in the field range between 9 and 12 T.

A major requirement for the use of $MgB_2$ wires in all mentioned applications is a high critical current density, and important efforts are presently being undertaken for enhancing this quantity. Today the industrial fabrication of $MgB_2$ wires follows two main powder metallurgical routes: the ex situ and the in situ techniques. Both techniques have been described in detail in the review of Collings et al. [1]. The main difference between the ex situ and in situ technique resides in the choice of the precursor powder particles, which are $MgB_2$ or Mg+B, respectively. A third method, the internal Mg fusion process (IMD), by Hur et al. [2], has the potential for large scale production, but has not been applied yet at a large scale.

From the wealth of published data it follows that the main requirements for optimized the critical current densities, $I_c$, in $MgB_2$ wires are high purity and a submicron size of the constituents B and Mg as well as of the Carbon based additives. In addition, it was found that the Boron nanopowders should be amorphous rather than crystalline. The size of the Boron particles is of great importance, the reaction kinetics leading to final $MgB_2$ grains well below 100 nm [3], thus the most appropriate initial particle size should ideally be in the nanosize range. It is now commonly accepted that the substitution of C on the B lattice sites enhances the residual resistivity $\rho_o$ and thus the upper critical field, $B_{c2}$, as well as the irreversibility field, $B_{irr}$, of $MgB_2$.

From the presently known data, it follows that the enhancement of $\rho_o$ within alloyed $MgB_2$ wires, where Carbon partially substitutes Boron in the $MgB_2$ lattice, is the dominant effect enhancing the critical current density, $J_c$, at high magnetic fields. So far, the pinning behavior of $MgB_2$ has been found to be little affected by the additives. This is confirmed by the relaxation data of Senatore et al. [4], who found for bulk samples with SiC and Carbon additives that the pinning energy $U_o$ of alloyed $MgB_2$ is unchanged with respect to the one of the binary compound. A further confirmation of this statement can be extracted from the data in the work of Collings et al. [1], who analyzed the effect of 42 additives.

A completely different approach for enhancing the transport properties of $MgB_2$ wires consists in enhancing the mass density of the $MgB_2$ filaments. The approach involving densification is particularly adapted to filaments produced by powder metallurgy, which have considerably lower mass densities compared to their theoretical value: in situ $MgB_2$ filaments have been reported to exhibit quite low mass densities, of the order of 45% of the theoretical value, 2.6 g/cm$^3$ [1,5]. Ex situ wires exhibit higher mass densities, but their value does not exceed 70% [1]. Various attempts have been undertaken for enhancing the mass density of bulk $MgB_2$ under high pressure/high temperature conditions. Prikhna et al. [6] reacted bulk alloyed samples at T>1000° C. in a multi-anvil device under pressures 2 GPa, while Yamada et al. [7] performed hot pressing on SiC alloyed in situ tapes at 630° C. under 100 MPa. In the bulk samples [6], the mass density was enhanced to values close to 100%, yielding $B(10^4)$=11 T at 4.2K, where $B(10^4)$ is the field at which $J_c$ reaches a value of $1 \times 10^4$ A/cm$^2$.

In the hot pressed tapes [7], the enhancement of $J_c$ was markedly higher, the extrapolated value of $B(10^4)^\parallel$ being close to 14T. However, these tapes have a high aspect ratio, leading to considerably lower values of $B(10^4)^\perp$, which, however, were not specified. The higher $J_c$ values for hot pressed tapes [7] in comparison with those of hot pressed bulk samples [6] are at least partly due to the fact that the deformation of tapes by rolling leads to a certain degree of texturing. Texturing is an inherent feature of $MgB_2$ wires and tapes produced by multistep deformation. On the basis of $MgB_2$ (002) rocking curves obtained by means of synchrotron X ray diffraction, Hassler et al. [8] have recently reported that the tape rolling procedure creates a texture in Mg which is transferred to the $MgB_2$ crystallites during reaction. Indeed, the reaction to $MgB_2$ starts already at temperatures slightly below 600° C., where Mg is still solid. The directional morphology of the Mg is always visible in cold deformed Mg+B powder mixtures.

As $MgB_2$ wires in kilometer lengths are necessary for industrial applications, this rules out combined high temperature/high pressure processing steps, which can only produce short lengths. Treatments by high isostatic pressure (HIP) can be envisaged, but the subsequent react and wind treatment of already reacted wires for the construction of magnets would be very difficult. It is clear then that the high pressure steps should be applied at low temperature, preferably at room temperature, thus allowing winding and cabling before the reaction heat treatment.

A room temperature processing technique was recently developed at the University of Geneva, namely the Cold High Pressure Densification, or CHPD (see Flükiger et al. [5]). EP 2 172 985 A1 is describing the principle of wire densification. The CHPD method is based on a press/release/travel cycle at room temperature, 4 hard metal anvils transmitting simultaneously a high pressure on all four sides of a square (or rectangular) wire, thus inducing an enhancement of mass density in the $MgB_2$ filaments on a length L. This densification step is followed by a pressure release, thus allowing the forward travel of the wire by a length L1<L, after which the cycle is repeated up to the whole wire length. As reported in [5, 10, 11], the operation with our laboratory device was successful in enhancing the mass density and the value of $J_c$ in $MgB_2$ wires prepared by the in situ technique. A considerable enhancement of $J_c$ was also obtained on ex situ wires.

In in situ wires, the densification step has the effect of enhancing the mass density of the unreacted Mg+B filament. Since the aspect ratio is controlled by the 4 anvils, the degree of texturing remains unchanged [5]. This is in contrast to the effect of pressing a tape between two walls: the tape flows in the direction parallel to the pressing walls, with the consequence that the aspect ratio is strongly enhanced, thus leading to a higher degree of texturing is enhanced, the mass density changing only slightly [6,7].

After applying CHPD on short in situ $MgB_2$ wires, the mass density of binary $MgB_2$ monofilaments after reaction was enhanced from 0.44% to 0.58±0.04% of the theoretical mass density after applying 2.5 GPa [5]. At the same time, a marked decrease of electrical resistance was observed on densified wires, reflecting an improved connectivity. The pressures applied on the 4-wall cell reached a maximum value of 6.5 GPa. At this pressure, the mass density $d_m$ of the unreacted Mg+B powder mixture reached 96%, while the corresponding value $d_f$ in the reacted $MgB_2$ filament increased up to ~73% of the theoretical value [5]. However, a reproducible enhancement of $J_c$ was only observed up to pressures of the order of ~3 GPa, higher pressures leading to large scattering $J_c$, showing no further improvement. The reasons for this limitation are not yet understood, but the behavior of $J_c$ at pressures above 3 GPa is irrelevant for the industrial application of CHPD. Indeed, the practical limit for hard metal anvils submitted to several thousands of pressure steps is of the order of 2 GPa.

The enhancement of $J_c$ in $MgB_2$ wires treated by the CHPD process was observed in monofilamentary and multifilamentary wire configurations, as well for binary and for the alloyed $MgB_2$/Fe wires of [5]. The observed enhancement was higher for the alloyed wires than for the binary ones. In most cases, the wire length was 45 mm, while the pressure length was chosen to L=29 mm. After densification at 1.85 GPa, for binary $MgB_2$ wires at 20K/5T and 4.2K/10T increased by 300% and 53% with respect to the as-drawn wire of the same batch, the reaction conditions being 1 hour at 650° C. After CHPD processing at 2.0 GPa on $MgB_2$ wires with $C_4H_6O_5$ additions [11] reacted for 1 h at 600° C. an even stronger enhancement of was observed. The value of the magnetic field at which a critical current density of $10^4$ A/cm$^2$ was determined, $B(10^4)^\parallel=1\times10^4$ A/cm$^2$ at 4.2 K was raised from 11.5T for the original wire to $B(10^4)^\parallel=13.8$ T and $B(10^4)^\perp=13.2$ T, respectively, for fields parallel and perpendicular to the wider face of the rectangular conductor, respectively (at a criterion of 1.0 μV/cm). The corresponding values at 20K were 5.9 and 5.75 T, respectively, while $B_{irr}^\parallel$ at 20K was ~11 T [11]. These values exceed the highest reported critical current densities on in situ $MgB_2$ round wires prepared without pressure: Susner et al. [12] reported for round SiC added $MgB_2$ wires the value of $B(10^4)=12$ T, using the 1 μV/cm criterion at 4.2 K.

However, although the pressure cell for CHPD presented in [5, 10] yielded very positive results, this previous device is applicable to short wire lengths only. Indeed, the operation with this device was time consuming: since the pressure release was obtained by loosening a series of screws, the time for a single press/release cycle followed by pressing on a neighbor position of the wire was 10 minutes and more, which is not appropriate for the densification of long wire lengths. In addition, the screws were found to undergo a plastic deformation during the application of pressure, the applied pressure on the elongated intermediate element showing a variation after a certain number of cycles. The uniformity of $J_c$ over the whole wire length being a main requirement for industrial wires, it is imperative that the applied pressure is exactly the same over a very large number of pressing cycles.

Very high pressures applied to the superconducting wires to increase $J_c$ lead to a short lifetime of the hard metal anvils. Exchange of the anvils, however, is not only at the expense of the material, but also interrupts the production cycle for some time.

Thus, the object of the invention is to introduce a device and method which produces high critical current densities $J_c$ at reduced pressure applied to the hard metal anvils.

SUMMARY OF THE INVENTION

This object is solved by the invention in a surprisingly simple but effective manner thereby that at least one of the hard metal anvils is a free moving anvil having clearances of at least 0.01 mm up to 0.2 mm towards the neighboring hard metal anvils, so that no wall friction is occurring between the free moving anvil and the neighboring anvils.

The clearances between the free-moving anvils and the other anvils are kept to a minimum that eliminates any possibility of friction and also avoids the possibility that the material of the metallic matrix of the intermediate element can flow in the space between. The other anvils will be impinging against each other to prevent such flow of matrix material.

In one experimental embodiment of the invention the absence of wall friction was for example obtained by a slight reduction of the width of one anvil with respect to the width of its counterpart. A difference as small as 0.02 mm has been used, which gave very interesting results: on pieces of the same wire, a similar enhancement of $J_c$ after densification was observed at P=0.85 GPa with the new device, which is considerably smaller than the pressure of 1.48 GPa obtained by a device as shown in EP 2 172 985 A1. The difference between 0.85 and 1.48 GPa is uniquely due to wall friction. This fact is very important, the important reduction of the applied forces leading to a considerable enhancement of the lifetime of the hard metal anvils.

In a preferred embodiment of the inventive device, the pressure block of the free moving anvil has a clearance towards the neighboring pressure blocks, so that no wall friction is occurring between the pressure block of the free moving anvil and the neighboring pressure blocks.

Another preferred embodiment of the inventive device is characterized in that the hydraulic presses work independent of each other. Two hydraulic presses act independently on the pressure blocks, the transmitted force being maintained constant, regardless of the number of cycles. Thus, the pressure acting on the wire is constant, not only through one pressing cycle, but through the whole sequence of cycles. This is in contrast to the device in [10], where only one hydraulic pump was used, the cell being hold together by a set of screws. The screws do not allow a great number of pressure steps with a controlled and constant pressure, because of their plastic deformation.

Advantageous is also an embodiment of the inventive characterized in that the pressure applied to the superconducting wire exceeds 0.2 GPa.

Another preferred embodiment is characterized in that superconducting wire has a cross-section area between 0.1 mm$^2$ and 50 mm$^2$, preferably between 0.8 mm$^2$ and 2 mm$^2$.

A very advantageous embodiment of the inventive device is characterized in that the pressing length of the hard metal anvils, which is touching the surface of the superconducting wire during densification, is at least 10 mm shorter than the total length, and in that the pressing length is at least 10 times longer than the diameter of the superconducting wire. In the present application, one declared goal is an enhancement of the mass density in the filaments. An elongation of the wire is not desired, since it would decrease the pressure on the wire, thus limiting the densifying effect in the filaments. The elongation of the wire is limited by the friction between the anvils and the wire, which is obtained by a sufficient length of the latter in longitudinal direction. The pressure applying faces of the anvils are in general flat (other shapes are possible) and perpendicular to the axial direction of the intermediate element. Anvils faces opposing each other are parallel over the length of the wire segment being pressed, for the general case they maintain a uniform distance distribution between them along the length. These pressure applying faces of the anvils are bordered at their extremities along the axis of the intermediate element by curved surfaces intended to remove/reduce stress concentrations at the ends of the pressed length L.

An enhancement of the previous embodiment is characterized in that the hard metal anvils (5, 6, 7, 8) comprise curved transition surfaces of at least 5 mm length on both edges.

Another embodiment is characterized in that the not free-moving anvils (5, 7, 8) are limited in their movement by impingement against at least one other of them.

In another preferred embodiment the superconducting wire contains powder mixtures based on Magnesium and Boron or on already formed $MgB_2$ and on additive powders containing between 0 and 20 wt. % Carbon. The $MgB_2$ phase is formed after an "in situ" reaction between 500° C. and 1000° C. or the superconducting wire contains already formed (="ex situ") $MgB_2$ powder mixtures containing between 0 and 20 wt. % Carbon. The superconducting wire is submitted to a sintering treatment at temperatures between 600° C. and 1000° C. and being separated from the metallic matrix, which is preferably comprising Cu, by a Nb, Ta, Ni or Ti barrier.

Alternatively another embodiment the superconducting wire contains powder mixtures chosen from the group of Bi, Sr, Ba, Pb, Cu and/or their oxides.

In other possible examples the superconducting wires contain powder mixtures of $NbSn_2$ and one or more additives, in particular up to 10 wt. % Sn and Cu, a $Nb_3Sn$ phase being formed by a reaction at temperatures between 550° C. and 800° C. and being separated from the metallic matrix, which is preferably comprising Cu, by a Nb barrier.

In another possible example the superconducting wires contain powder mixtures chosen from the group of Mo, Pb, Sn and S, a phase $PbMo_6S_8$ (=Chevrel phase) being formed by a reaction at temperatures between 800° C. and 1100° C. and being separated from the metallic matrix, which is preferably comprising Cu, by a barrier chosen from the group of Mo, Nb and Ta.

In yet another possible examples the superconducting wires contain powder mixtures chosen from the group of As, Fe and oxides based on an earth alkaline ($X^1$) and an alkaline element ($X^2$), a phase $X^1_{1-x} X^2_x Fe_2As_2$ being formed by a heat treatment at temperatures between 800° C. and 1100° C. and being separated from the metallic matrix, which is preferably comprising Cu, by a Nb or Ta barrier.

The present invention also comprises a method for the densification of superconducting wire out of compacted superconductor material or superconductor precursor powder particles with a high pressure device as described above, comprising a pressing step in which the high pressure is applied to the superconducting wire, a release step and a travel step, in which the superconducting wire is subjected to a forward movement (L1) in axial direction, said three steps forming a pressing cycle, which is repeated multiple times, if necessary, until the whole length of the superconducting wire has been submitted to the pressing cycle, characterized in that the high pressure is applied on the wire simultaneously by all 4 hard metal anvils, and that the high pressure is applied at least for 0.01 s. The present method has the particularity that all hard metal anvils can be positioned either simultaneously or sequentially, but that their high pressure action on the wire occurs concurrently, during a time of at least 0.01 seconds. This simultaneous action of all anvils is the condition for reaching the required very high pressure A preferred variant of the method is characterized in that the pressing step comprises the following steps in the order of listing Pressure block (9) is pushed against pressure block (10), the hard metal anvils (5, 7, 8) touching the wire without applying a force on it;

The pressing force P is selected;

The free moving anvil (6) is moved on the surface of the wire;

The pressure block (11) is transmitting the selected pressure P to the free moving anvil (6) while simultaneously the pressure block (9) applies the selected force P to the horizontal anvil (5).

Another preferred variant is characterized in that the duration of the press/release/travel cycle is variable and shorter than 3 seconds and is hold constant through all pressing cycles performed on the total length of the superconducting wire. The control of the hydraulic systems being very rapid, the duration of the press/release/travel cycle was shortened. A 3 second cycle with a traveling length of 20 mm corresponds to 22 meters of densified wire per hour, i.e. almost 200 meters a day. This speed can be considerably raised by enhancing the traveling length and by a faster control of the hydraulic presses.

In another advantageous variant the selected force P transmitted by the hydraulic presses is being maintained constant through all pressing cycles performed on the total length of the superconducting wire. Two hydraulic presses act independently on the pressure blocks, the transmitted force being maintained constant, regardless of the number of cycles. Thus, the pressure acting on the wire is constant, not only through one pressing cycle, but through the whole sequence of cycles. This is contrast to the device in [10], where only one hydraulic pump was used, the cell being hold together by a set of screws. The screws do not allow a great number of pressure steps with a controlled and constant pressure, because of their plastic deformation.

An advantageous variant of the inventive method is characterized in that the high pressure densification steps are performed at temperatures between −100° C. and +400° C., preferably at room temperature.

The invention is shown in the drawing:

DESCRIPTION OF THE PREFERRED EMBODIMENT

Figure 1:
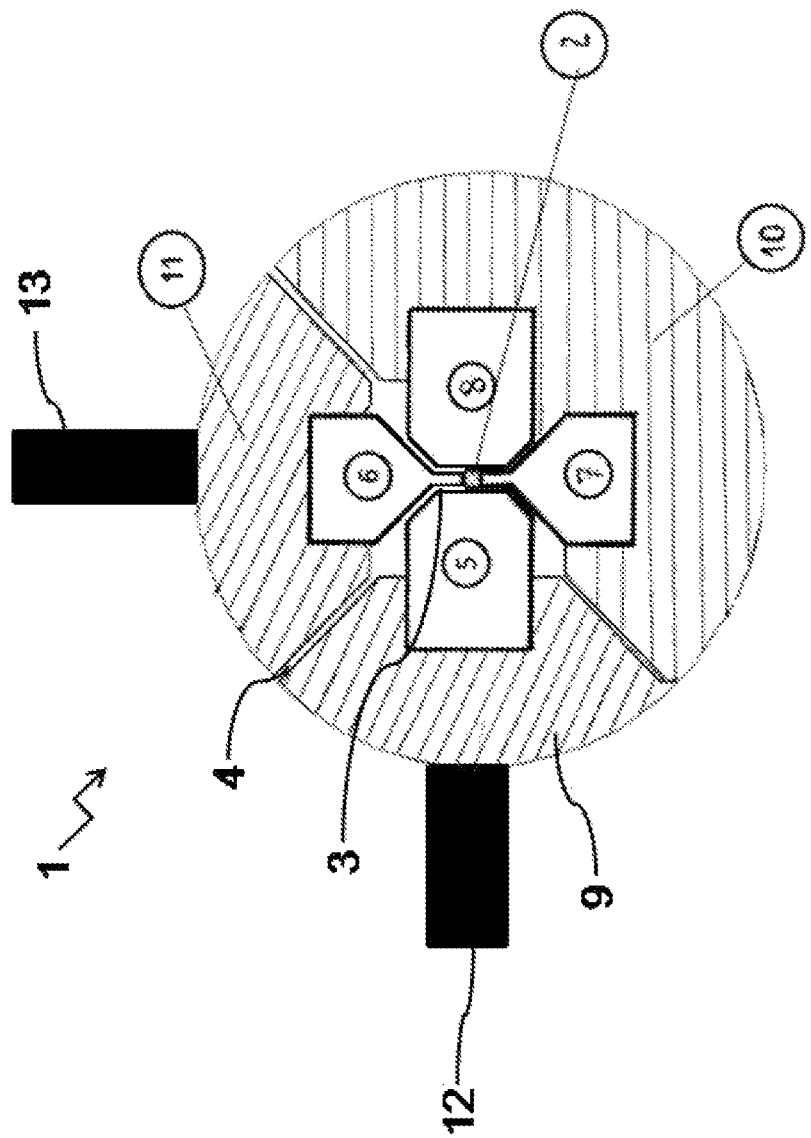
FIG. 1 a schematic drawing of the inventive device.

The inventive device comprises at least one free-moving anvil, which acts on the wire with the same force magnitude as the other anvils, without any interaction with the latter. There is thus no wall friction between the free-moving anvil and the other ones. This can be illustrated on the basis of FIG. 1, where the free-moving anvil 6 is depicted. The anvils 7, 8 on pressure block 10 are fixed, while the anvil 5 on pressure block 9 and the free-moving anvil 6 on pressure block 11 are driven by two independent hydraulic pumps 12, 13, transmitting the same force. The sequence is the following one: The pressure block 9 is pushed against pressing block 10, with a force K. The anvils 5, 7 and 8 may touch the wire surface, but do not yet apply a force on it. The force K is selected in that way that the anvil 5 will later apply a pressure P on the face of the wire. The pressure block 11 will then transmit the same pressure P to the free-moving anvil 6, which will in turn press on the wire. The free moving anvil 6 has clearings 3 towards the neighboring hard metal anvils 5, 8. Additionally the pressure block 11 of the free moving anvil 6 has clearings 4 towards the neighboring pressure blocks 9, 10.

Figure 2:
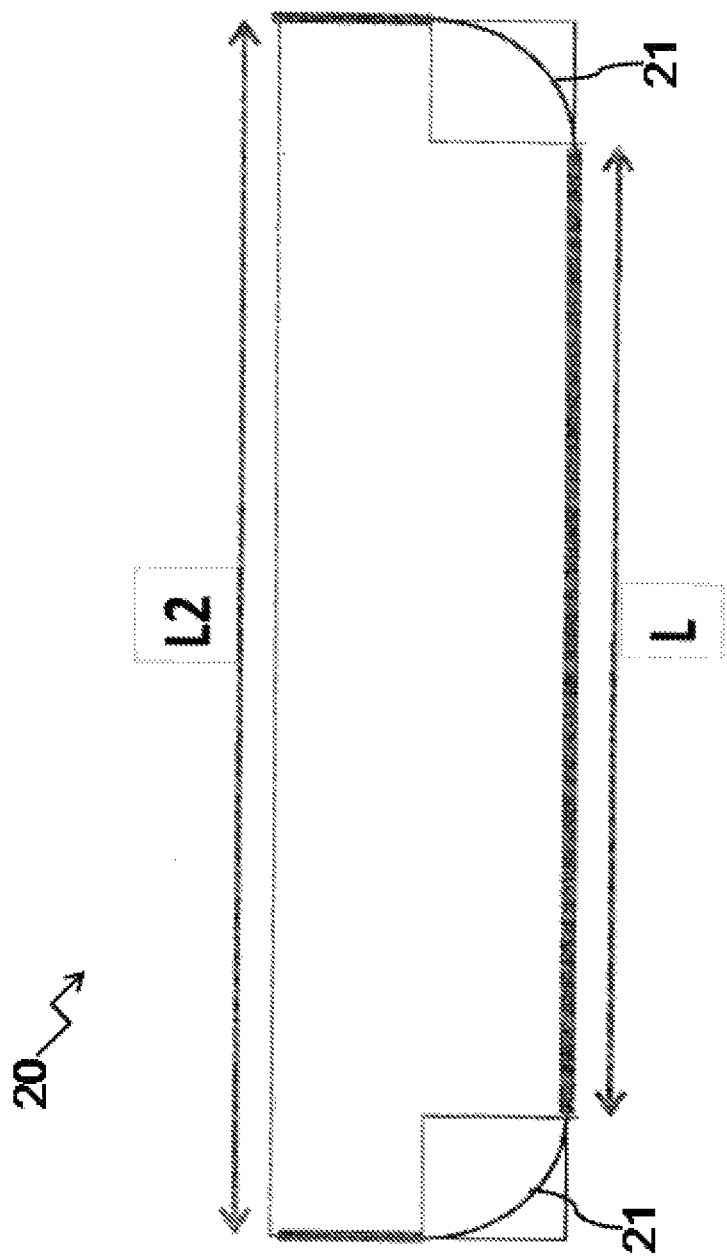
FIG. 2 a schematic drawing of an embodiment of a hard metal anvil of the inventive device.

FIG. 2 is showing a schematic drawing of an embodiment of a hard metal anvil of the inventive device. The hard metal anvil 20 has a total length L2. The pressing length L is the length of the part of the anvil 20 that is in contact with the wire. The pressing length L is shorter than the total length L2. It is advantageous to use curved edges 21 on both ends of the pressing length L.

Figure 3:
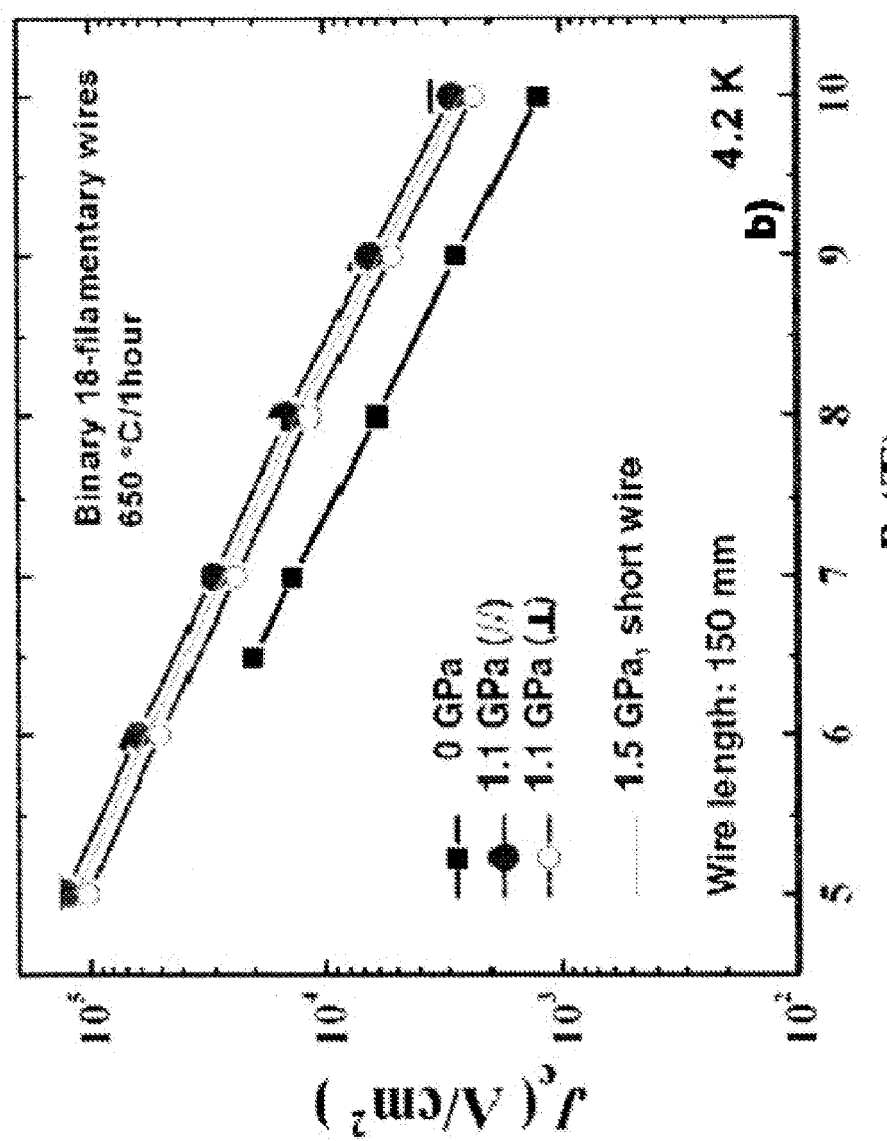
FIG. 3 a) $J_c$ vs. applied field B for a monofilamentary $MgB_2$ wire with $C_4H_6O_5$ additions, densified with 0.85 GPa over a length of 1 m with a forward movement of 20 mm by using the new press/release/advance device b) Cold densification of a binary multifilamentary $MgB_2$ wire densified at 1.1 GPa over a length of 150 mm with a forward movement of 20 mm.

FIG. 3 is showing results of laboratory measurements performed on superconducting wires treated by the inventive device.

A monofilamentary $MgB_2$ wire with 10 wt. % $C_4H_6O_5$ (malic acid) additive produced by the in situ technique having a diameter of 0.83 mm has first been deformed to a wire of 0.72×0.72 $mm^2$. This wire was densified at 300K with P=1.1 GPa over a length of 1 m with the inventive device, the final cross section being 1.02×0.71 $mm^2$. The anvil length was L=39 mm, the forward movement length L=20 mm and the cycle period 3 seconds. After a final reaction of 4 hours at 600° C., the results shown in FIG. 3a were obtained.

As shown in FIG. 3a, the repeated application of cold high pressure densification (CHPD) at 1.1. GPa over a length of 1 m leads to a strong enhancement of $J_c$ for $MgB_2$ wires with malic acid additives. The value of $J_c(4.2K)=1\times10^4$ $A/cm^2$ was obtained at 13.1 T for the parallel field direction, which is only slightly lower than the short sample value, 13.4 T (in both cases, with a criterion of 0.1 μV/cm).

The same parameters as in FIG. 3a were used for densifying a multifilamentary, malic acid added $MgB_2$ superconductor, with 18 filaments having an identical initial cross section and a wire length of 150 mm. The results in FIG. 3b show an enhancement of $J_c$ of a factor 2 over the whole field range.

The examples in FIG. 3 showed very similar results to the short sample values, which proves that a repeated application of the cold densification procedure with overlapping pressure regions does not influence the values of critical current density. These results can be extrapolated to industrial lengths.

REFERENCES

[1] E. W. Collings, M. D. Sumption, M. Bhatia, M. A. Susner, S. D. Bohnenstiehl, "Prospects for improving the intrinsic and extrinsic properties of $MgB_2$ superconducting strands", *Supercond. Sci. Technol.* vol. 21, p. 103001, 2008.

[2] J. M. Hur, K. Togano, A. Matsumoto, H. Kumakura, H. Wada, K. Kimura, "Fabrication of high-performance $MgB_2$ wires by an internal Mg diffusion process", *Supercond. Sci. Technol.*, vol. 21, p. 0320012008.

[3] J. H. Kim, Y.-U. Heo, A. Matsumoto, H. Kumakura, M. Rindfleisch, M. Tomsic, S. X. Dou, "Comparative study of mono- and multifilament $MgB_2$ wires with different B powders and malic acid addition", *Supercond. Sci. Technol.*, vol. 23, p. 075014, 2010.

[4] C. Senatore, P. Lezza, R. Flükiger, "Critical Current anisotropy: pinning properties and relaxation rate of ex situ $MgB_2$/Fe tapes", Adv. Cryo. Eng,. Vol. 52, p. 654, 2006.

[5] R. Flükiger, M. S. A. Hossain, C. Senatore, "Strong enhancement of $J_c$ and $B_{irr}$ in binary in situ $MgB_2$ wires after Cold High Pressure Densification (CHPD)", *Supercond. Sci. Technol.*, vol. 22, p. 085002, 2008.

[6] T. A. Prikhna, W Gawalek, V. M. Tkach, et al., "Effect of higher borides and inhomogeneity of oxygen distribution on critical current density of undoped and doped magnesium diboride", Journal of Physics: Conference Series, vol. 234, p. 012031, 2010.

[7] H. Yamada, M. Igarashi, Y. Nemoto, Y. Yamada, K. Tachikawa, H. Kitaguchi, A. Matsumoto, H. Kumakura, "Improvement of the critical current properties of in situ powder-in-tube processed MgB2 tapes by hot pressing", *Supercond. Sci. Technol.*, vol. 23, p. 045030, 2010.

[8] W. Hassler, P. Kovac, M. Eisterer, A. B. Abrahamsen, M. Herrmann, C. Rodig, K. Nenkov, B. Holzapfel, T. Melisek, M. Kulich, M. v. Zimmermann, J. Bednarcik, J.-C. Grivel, "Anisotropy of the critical current in $MgB_2$ tapes made of high energy milled precursor powder", *Supercond. Sci. Technol.* Vol. 22, p. 065011, 2010.

[9] R. Flükiger, "Procedure for the Densification of Filaments in a Superconductive Wire>>, Patent submitted, Nr. SP09659EP, 2008.

[10] M. S. A. Hossain, C. Senatore, R. Flükiger, M. A. Rindfleisch, M. J. Tomsic, J. H. Kim, S. X. Dou, "The enhanced and $J_c$ and $B_{irr}$ of in situ $MgB_2$ wires and tapes alloyed with $C_4H_6O_5$ (malic acid) after cold high pressure densification", *Supercond. Sci. Technol.*, vol. 22, p. 095004, 2009.

[11] R. Flükiger, M. S. A. Hossain, Carmine Senatore, Florin Buta and Matt Rindfleisch, "A new generation of in situ $MgB_2$ wires with improved $J_c$ and $B_{irr}$ values obtained by Cold Densification (CHPD)", presented at the ASC, 2010v published in *European Superconductivity News Forum*, Vol. 14, 23.10.2010, ST194.

[12] M. A. Susner, M. D. Sumption, M. Bhatia, X. Peng, M. J. Tomsic, M. A. Rindfleisch, E. W. Collings. "Influence of Mg/B ratio and SiC doping on microstructure and high field transport in $MgB_2$ strands", *Physica C*, vol. 456, p. 180, 2007.

[13] U.S. Pat. No. 3,837,210: "Process and machine for swaging rectangular-section workpieces", B. Kralowetz, Apr. 13, 1973.

We claim:

1. A device for high pressure densification of superconducting wire from compacted superconductor material or superconductor precursor powder particles, the device comprising:
    a first hard metal anvil;
    a second hard metal anvil disposed adjacent to said first hard metal anvil;
    a third hard metal anvil disposed adjacent to said second hard metal anvil and opposite to said first hard metal anvil;
    a fourth hard metal anvil disposed adjacent to said third hard metal anvil and said first hard metal anvil and opposite to said second hard metal anvil;
    a first pressure block in which said first anvil seats; and
    a first pressure device cooperating with said first pressure block to urge said first pressure block and said first anvil towards said third anvil,
    wherein said first anvil is a free moving anvil having clearances of at least 0.01 mm up to 0.2 mm with respect to said second and said fourth anvils, so that no wall friction occurs among said first, second, third and fourth anvils, said first, second third and fourth anvils having a total length parallel to the superconducting wire.

2. The device of claim 1, further comprising a second pressure block in which said second anvil seats and a second pressure device cooperating with said second pressure block to urge said second pressure block and said second anvil towards said fourth anvil.

3. The device of claim 2, wherein at least one of said first and said second pressure devices comprises a hydraulic press.

4. The device of claim 2, further comprising a stationary pressure block in which said third and said fourth anvil seat.

5. The device of claim 4, wherein said first pressure block has a clearance with respect to said second and said stationary pressure blocks so that no wall friction occurs among said first, said second and said stationary pressure blocks.

6. The device of claim 2, wherein said first and said second pressure devices work independently of each other.

7. The device of claim 1, wherein a pressure applied to the superconducting wire exceeds 0.2 GPa.

8. The device of claim 1, wherein the superconducting wire has a cross-section area between 0.1 mm$^2$ and 50 mm$^2$ or between 0.8 mm$^2$ and 2 mm$^2$.

9. The device of claim 1, wherein a pressing length of said first, second, third and fourth hard metal anvils contacts a surface of the superconducting wire during densification thereof said pressing length being at least 10 mm shorter than said total length and at least 10 times longer than a diameter of the superconducting wire.

10. The device of claim 9, wherein each of said first, second, third and fourth hard metal anvils has curved transition surfaces of at least 5 mm length on both edges thereof.

11. The device of claim 1, wherein anvils which are not free-moving are limited in movement by impingement against at least one other anvil.

12. The device of claim 1, wherein the superconducting wire contains powder mixtures based on Magnesium and Boron or on already formed MgB$_2$ and on additive powders containing between 0 and 20 wt. % Carbon.

13. The device of claim 1, wherein the superconducting wire contains powder mixtures selected from the group consisting of Bi, Sr, Ba, Pb, Cu and oxides thereof.

14. A method for densification of superconducting wire from compacted superconductor material or superconductor precursor powder particles using the high pressure device of claim 2, the method comprising the steps of:
   a) applying high pressure to the superconducting wire, the high pressure being applied simultaneously by the first, second, third and fourth hard metal anvils, wherein the high pressure is applied for at least 0.01 s;
   b) releasing the wire;
   c) transporting the wire via forward movement in an axial direction; and
   d) repeating steps a) through c) a plurality of times until an entire length of the superconducting wire has been submitted to a pressing cycle.

15. The method of claim 14, wherein step a) comprises the following steps, executed in sequence:
   a1) pushing the second pressure block such that the second, third and fourth hard metal anvils touch the wire without applying a force on the wire;
   b1) selecting a pressing force;
   c1) moving the first anvil to a surface of the wire; and
   d1) transmitting a selected pressing force to the first anvil while simultaneously applying that selected pressing force to the second anvil.

16. The method of claim 14, wherein a duration of a press, release and travel cycle is variable, is shorter than 3 seconds and is held constant through all pressing cycles performed along an entire length of the superconducting wire.

17. The method of claim 15, wherein the pressing force is maintained constant through out all pressing cycles performed on an entire length of the superconducting wire.

18. The method of claim 14, wherein high pressure densification steps are performed at temperatures between −100° C. and +400° C. or at room temperature.

* * * * *